United States Patent
Agari et al.

(10) Patent No.: US 7,388,569 B2
(45) Date of Patent: Jun. 17, 2008

(54) REFLECTION LIQUID CRYSTAL DISPLAY APPARATUS

(75) Inventors: Masafumi Agari, Tokyo (JP); Mitsuo Inoue, Tokyo (JP); Takashi Yamamoto, Tokyo (JP); Shigeyuki Yoshida, Tokyo (JP); Takao Sakamoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 430 days.

(21) Appl. No.: 10/496,948

(22) PCT Filed: Dec. 9, 2002

(86) PCT No.: PCT/JP02/12845

§ 371 (c)(1),
(2), (4) Date: May 26, 2004

(87) PCT Pub. No.: WO03/050602

PCT Pub. Date: Jun. 19, 2003

(65) Prior Publication Data

US 2005/0067553 A1 Mar. 31, 2005

(30) Foreign Application Priority Data

Dec. 10, 2001 (JP) .............................. 2001-375935

(51) Int. Cl.
*G09G 3/36* (2006.01)
*G09G 5/00* (2006.01)

(52) U.S. Cl. ...................... 345/102; 345/207; 345/690; 349/61; 349/106; 349/110; 362/561

(58) Field of Classification Search ................ 345/102, 345/207, 690; 349/61, 68, 106, 110; 362/561
See application file for complete search history.

(56) References Cited

U.S. PATENT DOCUMENTS

| 5,341,231 | A | | 8/1994 | Yamamoto et al. |
| 5,406,305 | A | * | 4/1995 | Shimomura et al. ........ 345/102 |
| 5,952,992 | A | * | 9/1999 | Helms ........................ 345/102 |
| 6,078,302 | A | * | 6/2000 | Suzuki ........................ 345/77 |
| 6,337,675 | B1 | * | 1/2002 | Toffolo et al. ................. 345/77 |
| 6,556,258 | B1 | * | 4/2003 | Yoshida et al. ............... 349/61 |
| 6,686,981 | B2 | * | 2/2004 | Noritake et al. ............ 349/113 |

(Continued)

FOREIGN PATENT DOCUMENTS

JP 61-32881 2/1986

(Continued)

*Primary Examiner*—Henry N Tran
(74) *Attorney, Agent, or Firm*—Leydig, Voit & Mayer, Ltd.

(57) ABSTRACT

A reflective liquid crystal display device is integrated with a liquid crystal display panel (1), detects display surface illuminance by a plurality of light sensors (10) provided in the vicinity of the display surface, and in accordance with the detection result, controls luminous intensity of a front light (lighting means) (19) using a lighting control circuit (22) so that the display surface illuminance becomes a predetermined magnitude. Even if the use environment of the reflective liquid crystal display device changes, or more specifically, intensity of external light shone from outside of the device into the display surface varies, the configuration allows controlling automatically the amount of emission from the front light to automatically maintain an appropriate display luminance and to reduce electric power consumption.

8 Claims, 11 Drawing Sheets

U.S. PATENT DOCUMENTS

| | | | |
|---|---|---|---|
| 6,809,718 B2 * | 10/2004 | Wei et al. | 345/102 |
| 6,847,424 B2 * | 1/2005 | Gotoh et al. | 349/113 |
| 6,891,530 B2 * | 5/2005 | Umemoto et al. | 345/173 |
| 6,995,753 B2 * | 2/2006 | Yamazaki et al. | 345/204 |

FOREIGN PATENT DOCUMENTS

| | | |
|---|---|---|
| JP | 63-21923 U | 2/1988 |
| JP | 3-249622 | 11/1991 |
| JP | 4-53925 | 2/1992 |
| JP | 4-174819 | 6/1992 |
| JP | 6-11690 | 1/1994 |
| JP | 2000-131137 | 5/2000 |
| JP | 2001-109434 | 4/2001 |

* cited by examiner

FIG.3A
FIG.3B
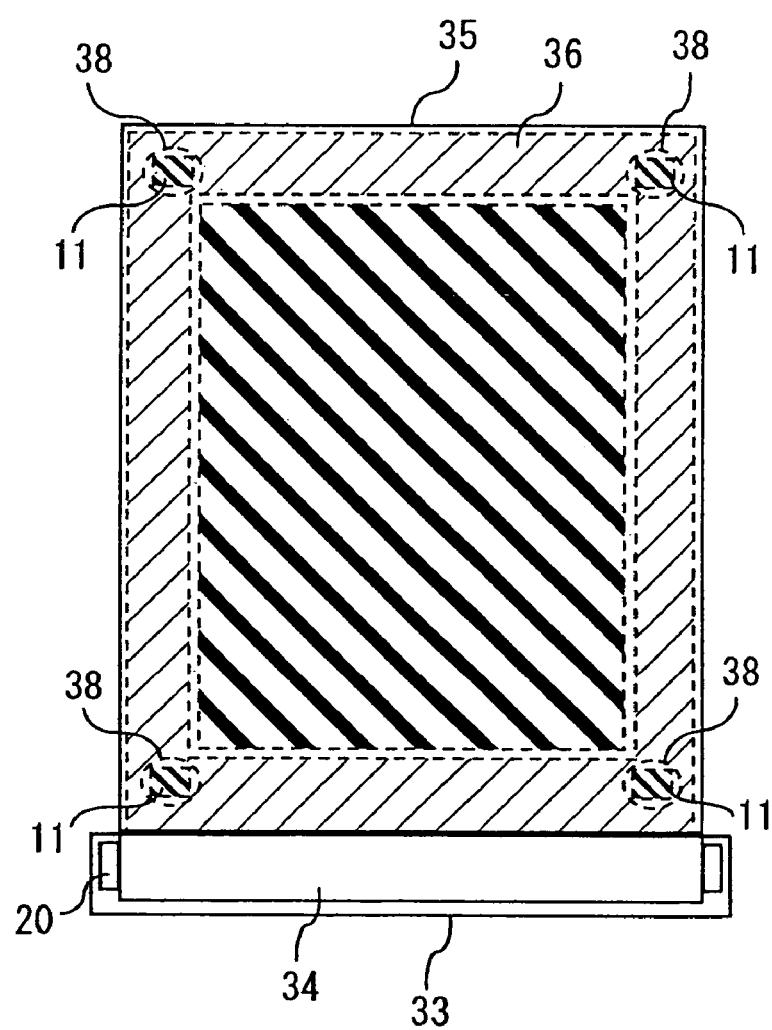
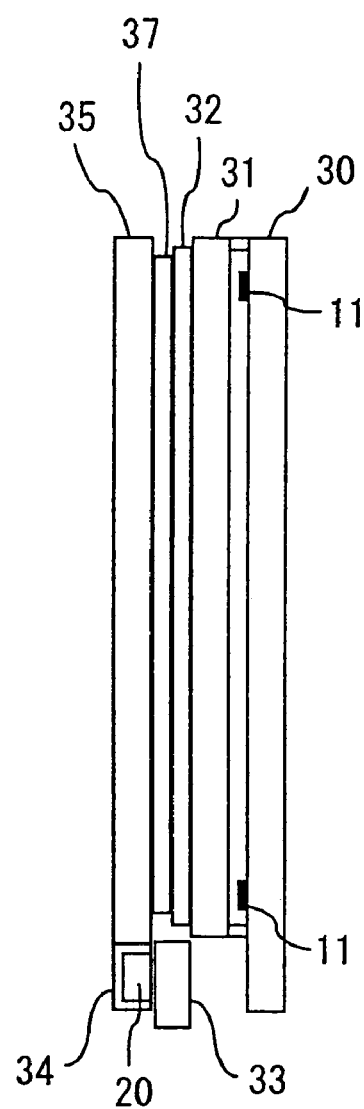

FIG.8A
FIG.8B
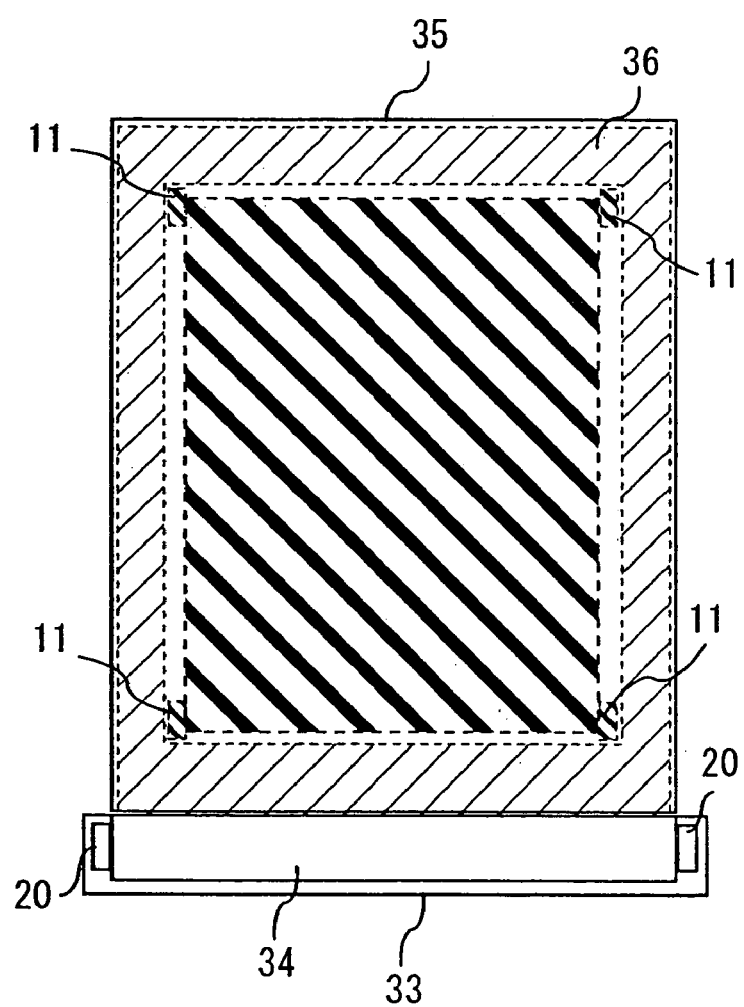
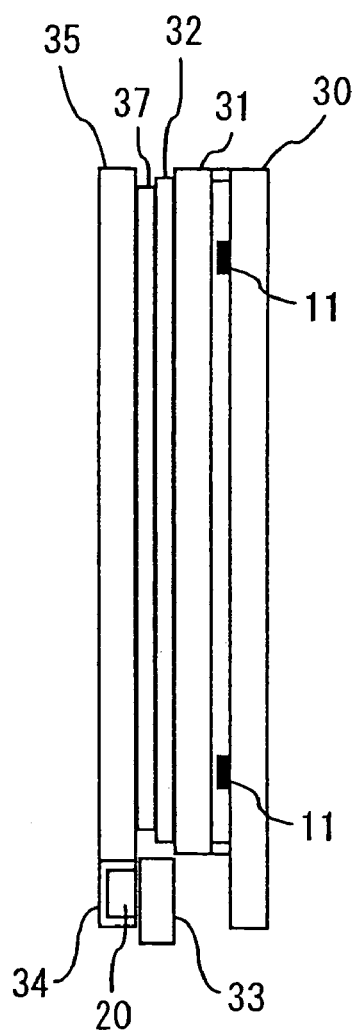

REFLECTION LIQUID CRYSTAL DISPLAY APPARATUS

TECHNICAL FIELD

The present invention relates to a reflective liquid crystal display device equipped with a front light on the front side of a liquid crystal display panel.

BACKGROUND ART

FIG. 12 is a diagram illustrating a configuration of a conventional reflective liquid crystal display device. In the figure, a liquid crystal display panel 1001 consists of a pixel matrix 1005, a scan driver circuit 1008, and a data driver circuit 1009, while each pixel constituting the pixel matrix 1005 is configured by a pixel TFT (thin film transistor) 1002, a liquid crystal capacitor 1003, and an additional capacitor 1004. The gate of each TFT 1002 in the pixel matrix 1005 is connected to a respective scan line 1006, and scanned by the scan driver circuit 1008. The source of each TFT 1002 in the pixel matrix 1005 is connected to a respective data line 1007, through which signals from the data driver circuit 1009 are written into each liquid crystal capacitor 1003. Provided as external circuits are: an image signal processing circuit 1016 for processing externally inputted image signals; a driver control circuit 1017 for controlling the scan driver circuit 1008 and the data driver circuit 1009; and an LED driver circuit 1021 for driving according to synchronization signals LEDs 1020 used as a light source for a front light 1019 installed on the front display side of the liquid crystal display panel.

Next, operations will be explained. The inputted image signals are inputted into the image signal processing circuit 1016, and then outputted to the data driver circuit 1009 as RGB data with a predetermined timing. In addition, the driver control circuit 1017 generates, according to the inputted synchronization signals, control signals for controlling the scan driver circuit 1008 and the data driver circuit 1009.

In the data driver circuit 1009, to begin with, shift pulses are generated by a start pulse STH and a shift clock signal CLKH that are inputted. Then the data for a single line is developed by the shift pulses sequentially latching RGB data for the single line. After being latched further with a common latch pulse LP, the latched RGB data is converted into analog signals and transferred to each data line.

Meanwhile, in the scan driver circuit 1008 shift pulses are sequentially generated by a start pulse STV and a shift clock signal CLKV that are inputted, and serve as signals for scanning the scan lines 1006.

In each pixel circuit that constitutes the pixel matrix 1005, when the scan line 1006 connected to the TFT 2 is scanned by the scan driver circuit 1008, the TFT 1005 turns conductive. Then the analog signal for the display line outputted to each data line 1007 from the data driver circuit 1009 is applied through the TFT 1002 to the liquid crystal capacitor 1003 and the additional capacitor 1004. The drain of the TFT 1002 is connected to a reflective electrode (not shown in the figure). A voltage in accordance with the difference between the voltage being applied via the TFT 1002, and the voltage of a transparent opposing electrode is applied to the liquid crystal capacitor 1003, and by the liquid crystal optically responding to the voltage, the reflectance of the RGB dots for each pixel varies in accordance with the RGB data. Thus, displaying onto the display surface is carried out.

Meanwhile, the LEDs 1020 that are the light source for the front light 1019 installed on the front side of the liquid crystal display panel 1 are driven by the LED driver circuit 1021 so that a forward current can flow, and then emit light. The front light 1019 is generally used as an auxiliary light source under a use environment in which, particularly in a room, for example, light incident from outside into the liquid crystal display panel 1001 is feeble.

Moreover, for example in another conventional reflective liquid crystal display device shown in Japanese Patent Laid-Open No. Hei 5-158034, between a pair of polarizers a liquid crystal display element is disposed to configure the device. In addition, between the liquid crystal display element and the polarizer an optical guide plate is disposed with an airspace intervening, and lamps are set up respectively along the outer sides of the opposing edge faces of the optical guide plate.

Thus it is disclosed that a light source device including an optical guide plate and a light source can be disposed on the front (display surface) side, whereby when the light source is on, even and favorable lighting is achieved, and when the light source is off, the optical guide plate turns transparent not to interfere with the incident light from outside, and to achieve favorable display.

Furthermore, in a conventional transmissive liquid crystal display device shown in Japanese Patent Laid-Open No. Hei 4-174819, it is disclosed that a light detection signal output from a separately provided photodetector is inputted, and that the device includes memory for beforehand storing a correlation between the light detection signal and the light intensity, and a controller 5 for adjusting the light intensity of a backlight in accordance with the signal output from the memory.

There has been a problem that in the conventional reflective liquid crystal display device including a front light (a light source unit installed on the front (display surface) side of the liquid crystal display device and including an optical guide plate and a light source) as mentioned above, because the luminous intensity of the front light is constant, if the external light illuminating from outside of the device varies, it causes the display surface illuminance to vary, whereby the display luminance varies.

There has been another problem that under a relatively bright use environment, even if an adequate display luminance is achieved with external light only, because the amount of emission from the front light is constant, the front light consumes electric power in vain.

There has been a further problem that the transmissive liquid crystal display device with a backlight requires memory for storing the relation between the result of detecting external light intensity and the amount of backlight emission, whereby the scale of a circuit increases.

The present invention has been made to resolve the conventional problems above-mentioned, and aims to provide a reflective liquid crystal display device in which even if the light intensity of the external light illuminating from outside of the device varies, the amount of front light emission can be automatically controlled to maintain automatically an appropriate display luminance.

DISCLOSURE OF THE INVENTION

A liquid crystal display device according to a first configuration of the invention includes a liquid crystal display panel for displaying by reflecting light incident through a display surface thereof, lighting means for shining light from a front side of the display surface, a light-detecting means for detecting illuminance of the display surface, installed in the vicinity of the display surface, and a lighting control means for controlling luminous intensity of the lighting means in accordance with a result of display surface illuminance detection by the light-detecting means, whereby the display surface illuminance can be controlled to a desired value, and even if the light intensity of external light illuminating from outside of the device varies, the amount of emission from its front light can be automatically controlled to maintain automatically an appropriate display luminance. Additionally, in a case under a relatively bright environment where adequate display luminance is achieved with external light only, the amount of emission from the front light can be lowered to reduce electric power consumed in vain by the front light. Moreover, because it is not necessary to use memory for storing beforehand the relationship between the display surface illuminance and the luminous intensity of the front light, an automatic light control can be easily realized with a simple circuit configuration.

Additionally, in a reflective liquid crystal display device according to a-second configuration of the invention, based on the first configuration, the light-detecting means is formed in the vicinity of a pixel matrix on an array substrate, whereby the display surface illuminance can be detected with fidelity to reduce error in controlling light from the front light. Moreover, it is not necessary to provide the light-detecting means separate from the liquid crystal display panel, whereby the device size can be kept from increasing.

In a reflective liquid crystal display device according to a third configuration of the invention, based on the second configuration, thin film transistors for the pixels are formed of low temperature polycrystalline silicon, and photodetectors in the light-detecting means are formed of amorphous silicon, and therefore the photo detectors can be integrated with the liquid crystal display panel, and it is not necessary to provide light-detecting means separately from the liquid crystal display panel, whereby the device size can be kept from increasing.

In a reflective liquid crystal display device according to a fourth configuration of the invention, based on the second configuration, because portions where a black matrix layer is not located are present at positions corresponding to photodetecting portions of the photodetectors, even if the photodetectors are located on the TFT array substrate directly below the black matrix layer on the periphery of the display surface, the photodetectors can detect light, whereby the size of the liquid crystal display panel and thus the liquid crystal display device can be kept from increasing.

In a reflective liquid crystal display device according to a fifth configuration of the invention, based on the second configuration, the photodetecting portions of the photodetectors are located at positions corresponding to a gap between the display surface region of the device and the black matrix layer, whereby the size of the liquid crystal display panel is not expanded peripherally, and thus the size of the liquid crystal display device can be kept from increasing.

A reflective liquid crystal display device according to a sixth configuration of the invention is configured, based on the third configuration, to supply a first potential to one end of a pair of components composed of the photodetecting element and a resistance element located on the array substrate and connected in series with the photodetecting element, to supply a second potential to the other end thereof, and to output the electric potential at the connection point between the photodetecting element and the resistance element, generated by resistance of the photodetecting element varying in accordance with illuminance at the photodetecting portion in the photo-receiving element, as the result of detecting the illuminance on the photodetecting portion in the photodetecting element, whereby a simple configuration variation in photodetecting element resistance can be picked out as the illuminance detection result.

A reflective liquid crystal display device according to a seventh configuration of the invention is configured, based on the sixth configuration, to correct nonlinearity of the connection-point potential of the photodetecting element and the resistance element with respect to illuminance at the photodetecting portion in the photodetecting element, and to control luminous intensity of the lighting means in accordance with the corrected result, and therefore the impact of the nonlinearity on the system that controls the luminous intensity of the front light can be eliminated, whereby the display surface illuminance can be controlled to be constant to maintain automatically an appropriate display luminance.

A reflective liquid crystal display device according to an eighth configuration of the invention, based on the first configuration, controls the lighting control means within a controllable range of the lighting control means to keep the display surface illuminance substantially constant, whereby even if the light intensity of external light illuminating from outside of the device varies, the amount of emission from the front light can be automatically controlled to maintain automatically a constant display luminance.

A reflective liquid crystal display device according to a ninth configuration of the invention, based on the first configuration, controls the lighting control means to control within a controllable range of the lighting control means the display surface illuminance so as to make the display surface illuminance be illuminance that is in accordance with external light illuminance, or more specifically, the display surface illuminance is controlled so as to increase as the external light illuminance increases, whereby an appropriate display luminance can be automatically maintained.

BRIEF DESCRIPTION OF THE DRAWINGS

FIGS. 3A and 3B are diagrams illustrating the positions of photodetecting elements in the liquid crystal display device according to the embodiment, in which FIG. 3A is a plan view illustrating the spatial relationship between the liquid crystal display panel and the front light, and FIG. 3B is a right side view taken rightward in FIG. 3A;

FIGS. 5A and 5B are diagrams illustrating art illuminance characteristic of the display surface according to the first embodiment, in which FIG. 5A is a diagram illustrating the relationship between display surface illuminance and conductance of the photodetecting element, and FIG. 5B is a diagram illustrating the relationship between the display surface illuminance and voltage Vm (voltage at a connection point between the photodetecting element and a reference resistance element);

FIGS. 8A and 8B are diagrams illustrating the positions of the photodetecting elements in the liquid crystal display device according to a second embodiment, in which FIG. 8A is a plan view illustrating the spatial relationship between the liquid crystal display panel and the front light, and FIG. 8B is a right side view taken rightward in FIG. 8A.

BEST MODE FOR CARRYING OUT THE INVENTION

The invention realized in a reflective liquid crystal display device light sensors that are integrated with the panel, and that automatically control the amount of emission from a front light if the external light intensity varies, in order to constantly maintain appropriate display luminance. More specifically, light sensors that are installed in the vicinity of the display surface, detect illuminance including both the lighting means (the front light) illuminating from the front side of the display surface and the external light, and in accordance with the detection result adjust the luminous intensity of the lighting means, whereby when the light intensity of the external light illuminating the display surface varies or the use environment changes, an appropriate luminance can be achieved. Since not only can the display surface illuminance be measured by light sensors in a convenient configuration, but also can be constantly measured, variation in illuminance can readily be followed.

Hereinafter, concrete embodiments of the invention will be described with reference to the drawings.

Embodiment 1.

Figure 1:
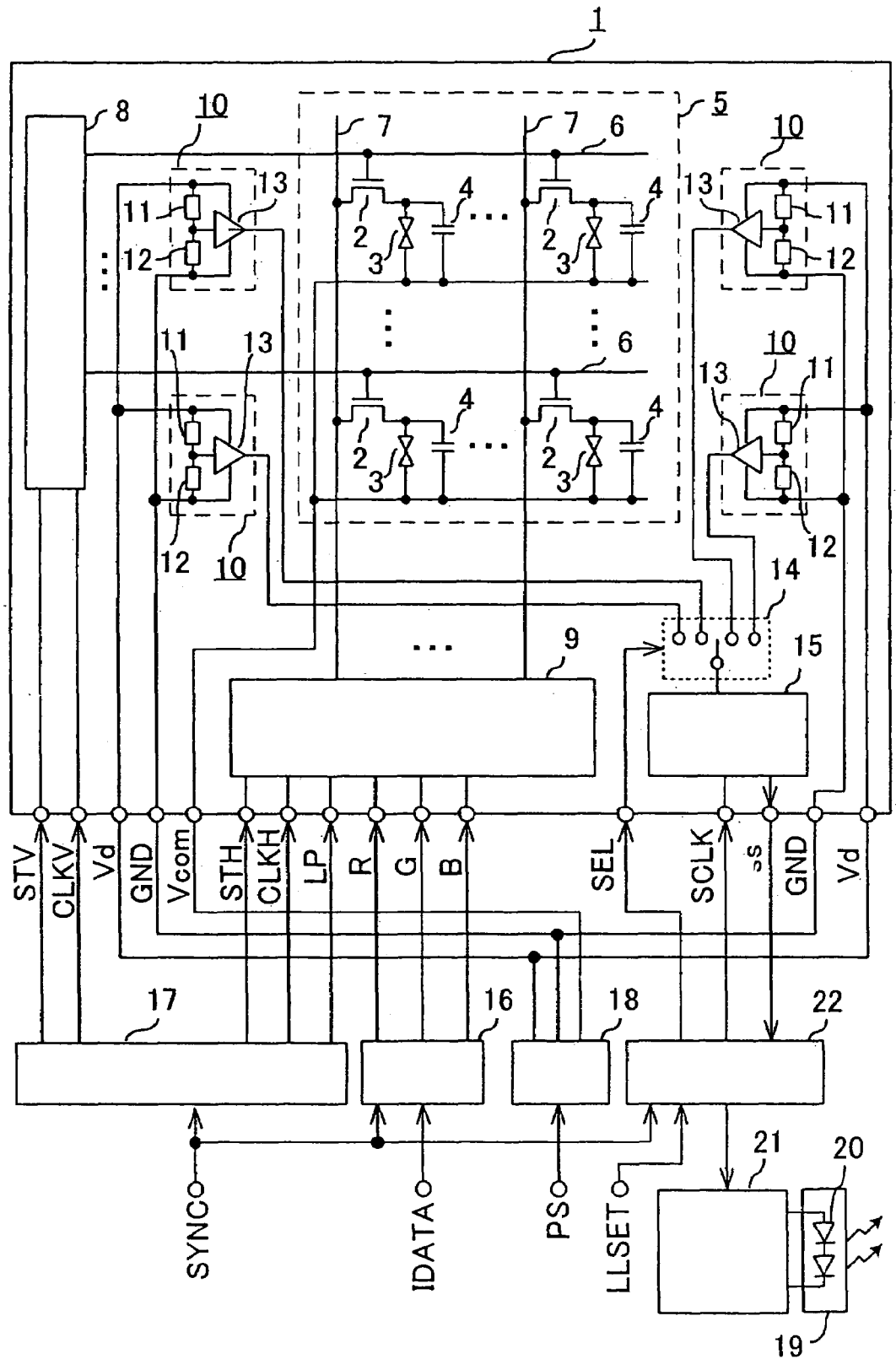
FIG. 1 is a diagram illustrating a circuit configuration of a liquid crystal display device according to a first embodiment of the invention.

FIG. 1 is a diagram illustrating a configuration of a reflective liquid crystal display device according to Embodiment 1 for carrying out the invention. In the figure, a liquid crystal display panel 1 is equipped with: a pixel matrix 5 including pixel TFTs (thin film transistors) 2, liquid crystal capacitors 3, and additional capacitors 4; a scan driver circuit 8 for scanning scan lines 6 connected to the gates of the pixel TFTs 2 in the pixel matrix 5, a data driver circuit 9 for outputting write signals for the liquid crystal capacitors 3 to data lines 7 connected to the sources of the pixel TFTs 2 in the pixel matrix 5, and light sensors 10. Each light sensor 10 includes a photodetecting element 11, a reference resistance element 12, and a buffer circuit 13 from which a signal is outputted via a selector circuit 14 to an A/D conversion circuit 15. The reflective liquid crystal display device includes as external circuits of the liquid crystal display panel: an image signal processing circuit 16 for processing externally inputted image signals; a driver control circuit 17 for controlling the scan driver circuit 8 and the data driver circuit 9; a power supply circuit 18 for supplying electric power to each unit of the display device; an LED driver circuit 21 for driving LEDs 20 used as light sources of a front light 19 that has been installed on the front side of the display panel; and a lighting control circuit 22 for controlling the LED driver circuit 21.

Additionally, here, each pixel configuring the pixel matrix 5 includes a reflecting electrode (not shown in the figure) connected to the drain of the TFT 2, and the liquid crystal display panel 1 is a reflective liquid crystal display panel for displaying an image by reflecting display-surface incident light. Moreover, it is assumed that the pixel TFTs 2, the scan driver circuit 8, the data driver circuit 9, the selector circuit 14, and the A/D conversion circuit 15 are formed on a later-described TFT array substrate 30 by low temperature polycrystalline silicon TFTs (low temperature polysilicon TFTs).

Figure 2:
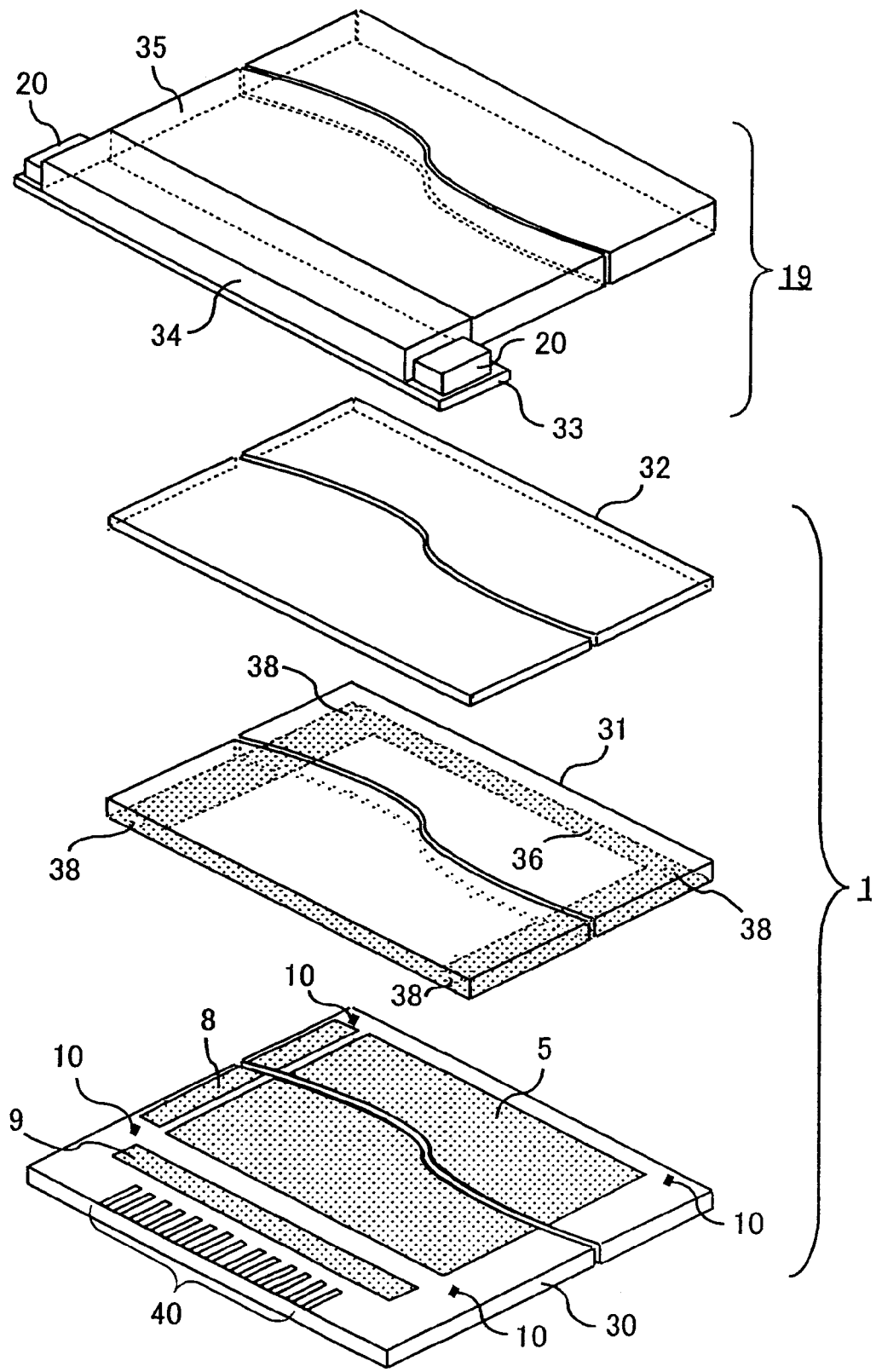
FIG. 2 is a development configuration diagram illustrating a configuration of a liquid crystal display panel and a front light in the liquid crystal display device.

Furthermore, although the source and the drain of the pixel TFT 2 would differ according to the current direction, for convenience the description here will be made assuming that the source is a terminal connected to the data line 7. FIG. 2 is a development configuration view for illustrating the rough configuration of the liquid crystal display panel 1 and the front light 19 disposed on the front side of the panel, which configure the liquid crystal display device. To begin with, the configuration of the liquid crystal display panel 1 will be described. In the TFT array substrate 30, on a glass substrate, the pixel matrix 5, the gate driver circuit 8, the data driver circuit 9, the light sensors 10, the selector circuit 14, the A/D conversion circuit 15, the connector terminals 40, and various types of wiring are formed. (The selector circuit 14, and the A/D conversion circuit 15 are not shown in FIG. 2.) Moreover, on a color filter substrate 31, a color filter, a black matrix, a common transparent electrode, and the like are formed. Then, after forming the liquid crystal cell by sealing with sealing agent around the TFT array substrate 30 and the color filter substrate 31, liquid crystal material is injected though an injection hole of the liquid crystal cell, which is then sealed. Thus, the liquid crystal material is clamped between the TFT array substrate 30 and the color filter substrate 31, and meanwhile on the color filter substrate 31, a polarizer 32 is adhered. In addition, the connector terminals 40 of the TFT array substrate 30 are electrically connected via an FPC (flexible printed circuit) or the like to a separately provided circuit board (not shown in the figure).

Meanwhile, the front light 19 is constructed as follows. The LEDs 20 are mounted on a substrate 33, and are electrically connected through the connector terminals (not shown in the figure) on the substrate 33 to the LED driver circuit 21 mounted on the separately provided circuit board (not shown in the figure). It is assumed that as the LEDs two white-light chip LEDs are used. The light emitting surfaces of the two LEDs 20 are disposed in the vicinity of or in contact with the respective incident surfaces of a light guide 34. The emitted light from the LED 20 comes through the light guide 34 into an incident surface of an optical guide plate 35, which faces a side of the light guide, and then the light is irradiated through the optical guide plate 35 toward the display surface of the liquid crystal display panel 1.

FIG. 3A and 3B are diagrams illustrating the spatial relationship between the liquid crystal display panel 1 and the front light 19, wherein FIG. 3A is a plan view and FIG. 3B is a right side view as viewed from right side of FIG. 3A. The liquid crystal display panel 1 and the front light 19 are fixed by means of a holder (not shown in the figure) over the display surface of the liquid crystal display panel 1 so as to bring a light-output surface of the optical guide plate 35 of the front light 19 close to the display surface. Here, the spacing between the liquid crystal display panel 1 and the optical guide plate 35 of the front light 19 is kept constant with a spacer sheet 37.

It is assumed that in this case four, for example, light sensors 10 are provided, in which photodetecting portions of the photodetecting elements 11 are disposed in the vicinity of the four corners on the periphery of the pixel matrix 5.

Moreover, in order to detect both the display-surface incident light from the front light 19 and the external light illuminating the display surface from around the display device, a black matrix layer 36 that has been formed on the inner side (underside) of the color filter substrate 31 cannot be present at the positions corresponding to the photodetecting elements 11. Numerals 38 denote portions where the black matrix is not present.

Figure 4:
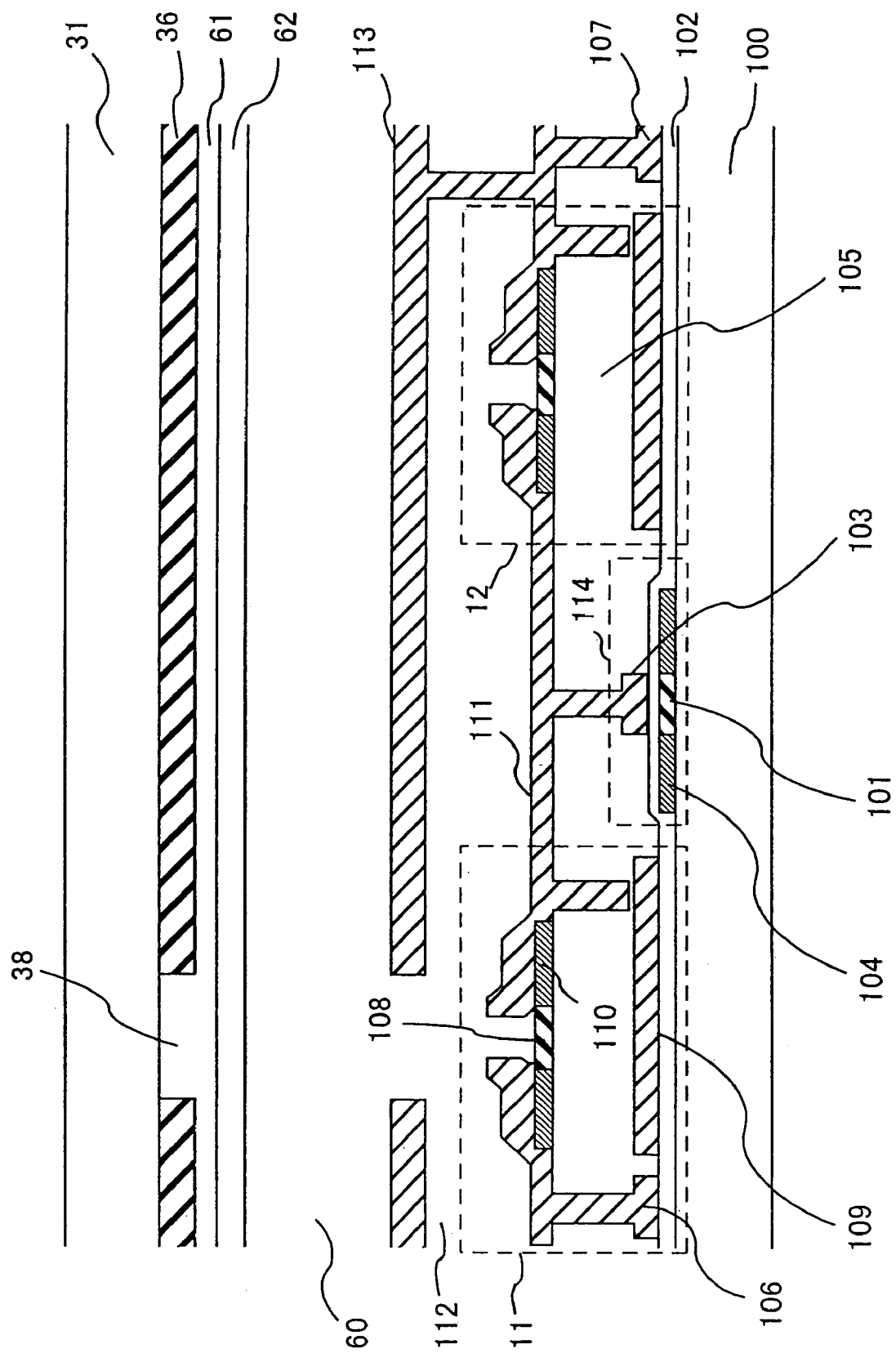
FIG. 4 is a sectional view illustrating a configuration of a TFT array substrate and a color filter substrate.

FIG. 4 is a schematic partial view in section illustrating the configurations of the light sensors 10 formed on the TFT array substrate 30 and the black matrix layer 36 formed on the color filter substrate 31.

To begin with, on a glass substrate 100, a laser-crystallized polycrystalline silicon film 101, a gate insulation film 102 consisting of an $SiO_2$ film, a gate electrode 103 consisting of a metal film, and a polycrystalline silicon TFT 114 including source/drain regions 104 where phosphorus ions have been implanted into a polycrystalline silicon film 101 are for example formed. Additionally, an interlayer insulation film 105 consisting of an $SiO_2$ film is formed so as to cover the polycrystalline silicon TFT 114.

Moreover, when the gate electrode 103 is formed, driving voltage wiring 106 and ground wiring 107 are formed.

Over the interlayer insulation film 105, an amorphous silicon film 108 is formed so as not to overlap the polycrystalline silicon TFT 114. Additionally, a light shielding metal film 109 is formed directly below the amorphous silicon film 108 with the interlayer insulation film 105 intervening. Then, ions are implanted into an electrode formation portion 110 in the amorphous silicon film 108.

In the interlayer insulation film 105 contact holes for connecting the electrodes and the wiring are appropriately provided.

To connect the thin film transistor, the amorphous silicon film, the driving voltage wiring, and the ground wiring, a metal film 111 that connects the contact holes and the ion implanted portion in the amorphous silicon film is formed, and additionally over the film layer, an insulation film 112 consisting of SiN is formed. Then, a light shielding metal film 113 is formed on the amorphous silicon film used as a reference resistance element.

Meanwhile, the black matrix layer 36 is formed on the inner face (undersurface) of the color filter substrate 31. The black matrix layer 36 is formed on the margin of the display surface so as to surround that portion of the display surface that corresponds to the above-mentioned pixel matrix 5. Moreover, the black matrix layer 36 is formed also in the portions corresponding to the spaces between the pixels of the pixel matrix 5, and also between R (red) G (green) B (blue) dots constituting the pixels. Furthermore, above the surface of the black matrix layer 36 a transparent electrode layer 62 is formed with a protective layer 61 intervening.

Here, in the portions corresponding to the amorphous silicon film 108 that constitutes the photodetecting elements 11, as described above, the portions 38 where the black matrix layer 36 is not present are provided so as not to prevent the amorphous silicon film 108 from detecting illuminating light from the front tight 19 and the external light.

Next, operation of the light sensor 10 formed as stated above will be described.

As mentioned above, the photodetecting element 11 and the reference resistance element 12 are connected at one end, while the other end of the photodetecting element 12 is connected to the driving wiring, and the other end of the reference resistance element 12 is connected to the ground wiring. Thus, the photodetecting element 11 and the reference resistance element 12 are cascaded.

Here, given that Rs is resistance of the photodetecting element 11, Rr is resistance of the reference resistance element 12, Vd is voltage applied to the driving wiring, and Vm is voltage at the connection point between the photodetecting element 11 and the reference resistance element 12, then Vm is expressed as the following equation (1).

$$Vm = Vd \times Rr/(Rs+Rr) \qquad (1)$$

Figure 5A:
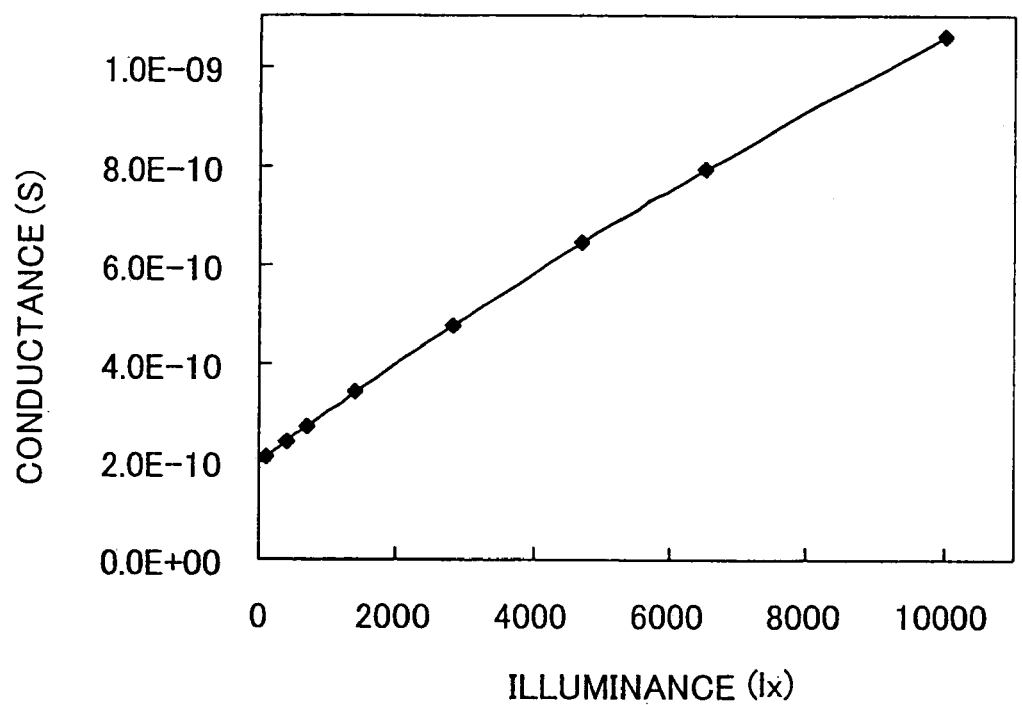

As the result of an experiment by the inventors, it was confirmed that the amorphous silicon film 108 constituting the photodetecting element 11 takes on a characteristic in which conductance of the photodetecting element 11 increases approximately linearly with respect to illuminance of the irradiating light, as shown in FIG. 5(a). In the example, W=100 (μm) where W is width of the gate electrode constituting the photodetecting element 11, and L=20 (μm) where L is length of the gate electrode.

Figure 5B:
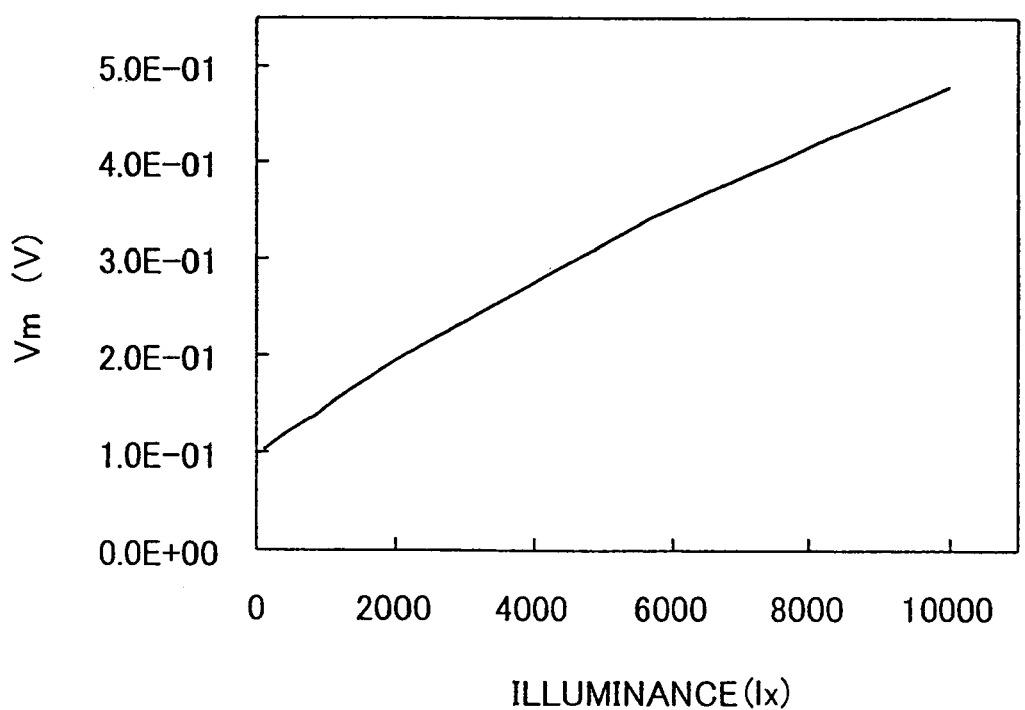

As for the photodetecting element with such a characteristic, the voltage Vm at the connection point between the photodetecting element 11 and the reference resistance element 12 increases approximately linearly with respect to illuminance of the irradiating light, as shown in FIG. 5(b). In the example, a case is illustrated wherein Rr=100 (MΩ), where Rr is resistance of the reference resistance element 12, and Vd=5 (V), where Vd is voltage applied to the driving wiring.

According to the relationship shown in the equation (1) above described, sensitivity of Vm with respect to the intensity of the irradiating light gets higher as Rr increases where Vm is voltage at the connection point between the photodetecting element 11 and the reference resistance element 12.

In a case where the sensitivity is too low, taking into account variation in gain and offset of the later-stage buffer circuit 13, etc., errors in detecting the display surface illuminance will become larger, and meanwhile in a case where the sensitivity is too high, dynamic range of detection will become smaller.

Taking those into account, the detection sensitivity is specified by appropriately selecting the width W and the length L of the gate electrode that constitutes the photodetecting element 11 and the reference resistance element 12.

Next, operation of the liquid crystal display device according to the embodiment will be described based on FIG. 1. To begin with, display operation using the pixel matrix 5 will be briefly described.

Inputted image signals IDATA are inputted into the image signal processing circuit 16, and then outputted to the data driver circuit 9 as RGB data with a predetermined timing. In addition, the driver control circuit 17 generates control signals for controlling the scan driver circuit 8 and the data driver circuit 9 according to inputted synchronization signals SYNC.

In the data driver circuit 9, to begin with, shift pulses are generated by a start pulse STH and a shift clock signal CLKH that are inputted. Then the data for a single line is developed by the shift pulses sequentially latching RGB data for the single line. After being latched further with a common latch pulse LP, the latched RGB data is converted into analog signals and transferred to each data line.

Meanwhile, in the scan driver circuit 8 shift pulses are sequentially generated by a start pulse STV and a shift clock signal CLKV that are inputted, and serve as signals for scanning the scan lines 6.

In each pixel circuit that constitutes the pixel matrix 5, when the scan line 6 connected to the pixel TFT 2 is scanned by the scan driver circuit 8, the pixel TFT 2 turns conductive. Then the analog signal for the display line outputted to each data line 7 from the data driver circuit 9 is applied through the pixel TFT 2 to the liquid crystal capacitor 3 and the additional capacitor 4. The drain of the pixel TFT 2 is connected to a reflective electrode (not shown in the figure). A voltage in accordance with the difference between the voltage being applied via the pixel TFT 2, and the voltage of the transparent opposing electrode 62 is applied to the liquid crystal capacitor 3 clamped between the reflective electrode and the transparent opposing electrode 62 shown in FIG. 4, and by the liquid crystal optically responding to the voltage, the reflectance of the RGB dots for each pixel varies in accordance with the RGB data. Consequently, the incident light from the display surface of the liquid crystal display panel 1 is reflected by the reflecting electrode in the pixel circuit constituting the pixel matrix 5, and turns into display light in accordance with the RGB data. Thus, displaying onto the display surface is carried out.

The power supply circuit 18 supplies, according to power source PS supplied from outside the device, source power of a given voltage to the liquid crystal display panel 1 and the LED driver circuit 21. Here, it is assumed that the image signal processing circuit 16, the driver control circuit 17, and the lighting control circuit 22 are driven by the power source PS externally supplied to the liquid crystal display device.

Next, light control operation of the front light 19 according to the display surface illuminance detected by photodetecting element 11 constituting the light sensor 10 will be described. As described above, the voltage Vm at the connection point between the photodetecting element 11 and the reference resistance element 12 is transmitted via the buffer circuit 13 to the selector circuit 14.

Here in the embodiment, it is assumed that four light sensors 10 are disposed in the vicinity of the four corners of the liquid crystal display panel 1.

An output signal from each light sensor 10 having been transmitted to the selector circuit 14 is inputted through the selector circuit 14 into the A/D conversion circuit 15. Here, the lighting control circuit 22 generates a selector switching signal SEL according to a synchronization signal that is inputted into the device, and switches the connection in the selector circuit 14. It is assumed that the output signal from the light sensors 10 is switched by the selector circuit 14 in the order upper left, to lower left, to upper right, to lower right to be inputted into the A/D conversion circuit 15. The A/D conversion circuit 15 converts sequentially from analog to digital the inputted output signal from the light sensors 10, and then in synchronization with serial clock signals generated by the lighting control circuit 22, the signal is inputted as serial digital data into the lighting control circuit 22. Digital illuminance detection signal ss indicating the display surface illuminance detected by the photodetecting element 11 is thus inputted into the lighting control circuit 22.

Thus, because the output signal from each light sensor 10 is switched by the selector circuit 14 and is inputted into the A/D conversion circuit 15, the A/D conversion circuit 15 can be commonly used to keep the size of the liquid crystal display panel 1 from increasing. Moreover, because the output of the A/D conversion circuit 15 is outputted as serial digital data, the number of terminals for outputting from the liquid crystal display panel 1 can be reduced in comparison with the case when being outputted as parallel data.

The lighting control circuit 22 controls, according to the digital illuminance signal indicating the display surface illuminance, through the LED driver circuit 21, the amount of emission from the LED 20 used as a light source for the front light 19, so as to keep the display surface illuminance approximately constant.

Here, because the liquid crystal display device according to the embodiment is a reflective liquid crystal display device for displaying using light that illuminates the display surface and is reflected at it, the luminance of the display surface can be controlled by controlling the display surface illuminance.

On this occasion, according to a light control level setting signal LLSET externally inputted into the device, the lighting control unit 22 switches the magnitude of the display surface illuminance to be controlled, that is, the light control level. This allows the display luminance to be changed according to the preference of the user that uses the device. Additionally, although the light control level may be defined in several stages, or may be defined continuously, here for simplicity, an example where the light control level for lighting is defined in three stages according to the light control level setting signal will be described.

Figure 6:
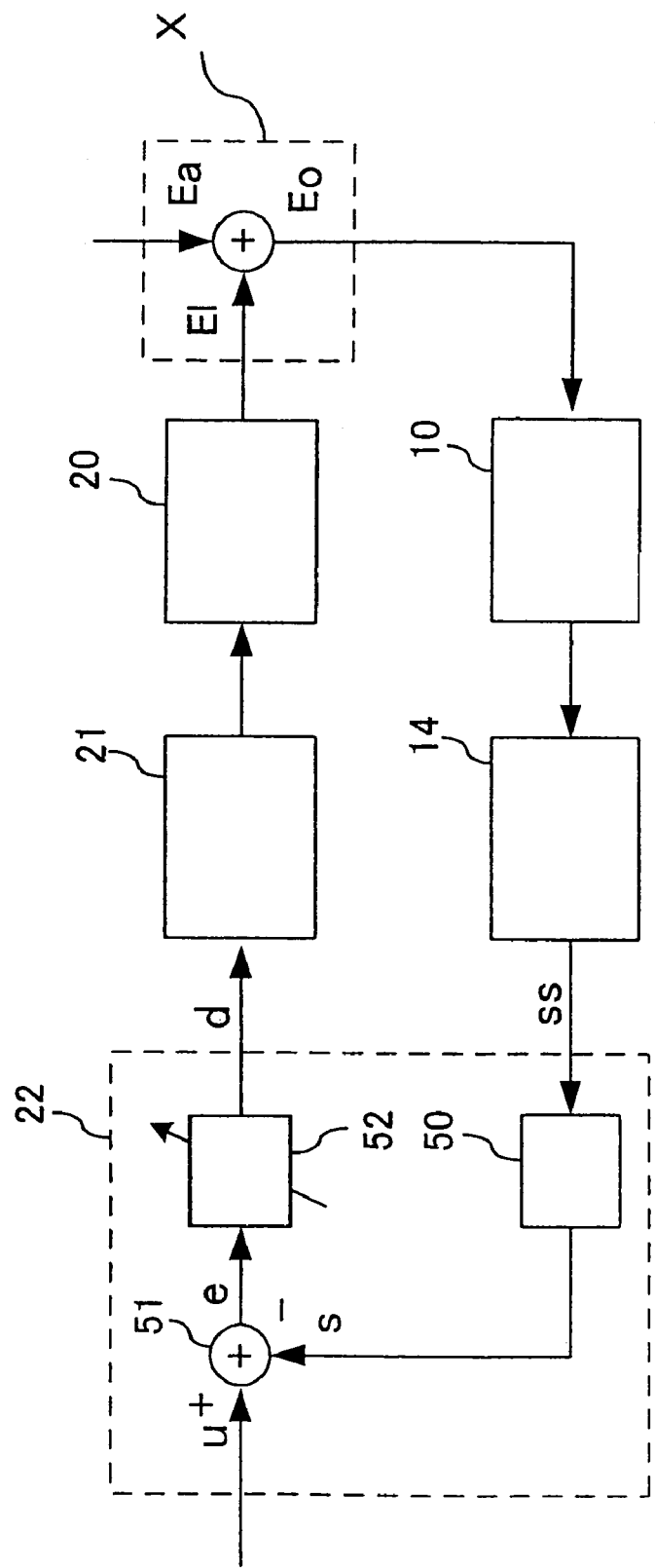
FIG. 6 is a diagram illustrating a control system for the front light.

Next, a method for controlling the display surface illuminance will be described. FIG. 6 illustrates a configuration of the control system for the front light 19, which forms a type of feedback control system. Illuminance (lighting illuminance) El wherein the light emitted from the LED 20, the light source for the front light 19, illuminates a display surface X, and illuminance Ea wherein, for example, lighting in a room in which the device is used illuminates the display surface from outside of the device, are synthesized on the display surface, and as the result, display surface illuminance Eo is obtained, which becomes the control target.

As described above, the display surface illuminance Eo is detected by the light sensor 10, and the detection result is turned into the digital illuminance detection signal by the A/D conversion circuit 14.

Although in the example shown in FIGS. 5A and 5B the characteristic of the voltage Vm at the connection point between the photodetecting element 11 and the reference resistance element 12, that is, of the illuminance detection signal from the light sensor 10, with respect to the display surface illuminance Eo is approximately linear, in the lighting control circuit 22 the gain is corrected by a gain unit 50 to further enhance the linearity, and then a corrected digital illuminance detection signal s is obtained.

In a case where nonlinearity of the characteristic of the illuminance detection signal from the light sensor 10 with respect to the display surface illuminance Eo is not problematic, obviously the gain unit 50 would be omissible.

In the embodiment, four light sensors 10 are provided, wherein to begin with digital illuminance detection signals are obtained for each light sensor 10 several times every predetermined time interval, then the time average value of the corrected digital illuminance detection signals is obtained, and further the average of this value for the number of sensors (in this case, the average of the four sensors) is obtained. This allows improving detection accuracy of the display surface illuminance.

In a case where a front light is used, because as described above the front light is disposed over the display surface, and further over that a cover (window) is generally installed, the display surface is sometimes set rather far back. Therefore, the photodetecting elements disposed on the periphery of the display surface conceivably could be in the shadow of the case of an information apparatus or the like that the display device is attached to, and prevented from receiving surrounding external light.

Here, because the average of the four light sensors 10 is taken, even if a photodetecting portion in one of the light sensors 10 is in the shadow of the case or the like and cannot detect the real display surface illuminance, the resulting degradation in detection accuracy can be reduced.

Meanwhile, the lighting control circuit 22, based on the light control level setting signal externally inputted according to the user's preference, changes the control target u and establishes it in an error detection unit 51. In the error detection unit 51 the error e in the corrected digital illuminance detection signal s with respect to the control target u is obtained. Then after the gain in a variable gain unit 52 is varied to reduce the error e, an LED control signal d is transmitted to the LED driver circuit 21.

Here, it is assumed that the amount of emission from the LED 20 is adjusted by varying light emission duty ratio (on/off duty ratio). Accordingly, this means that the LED control signal d is transmitted to the LED driver circuit 21 as a PWM (pulse width modulation) signal.

Then the LED driver circuit 21 controls "illuminate/not illuminate" (on/off) of the LED 20 by controlling conduction/cutoff of the forward current through the LED 20 according to the emission duty that the driver control signal d indicates.

Note that the flashing frequency of the LED 20 is set to a frequency high enough, such as more than several hundred kHz, such that change in luminance on the display surface, that is, flicker, will not be visually recognized.

Figure 7:
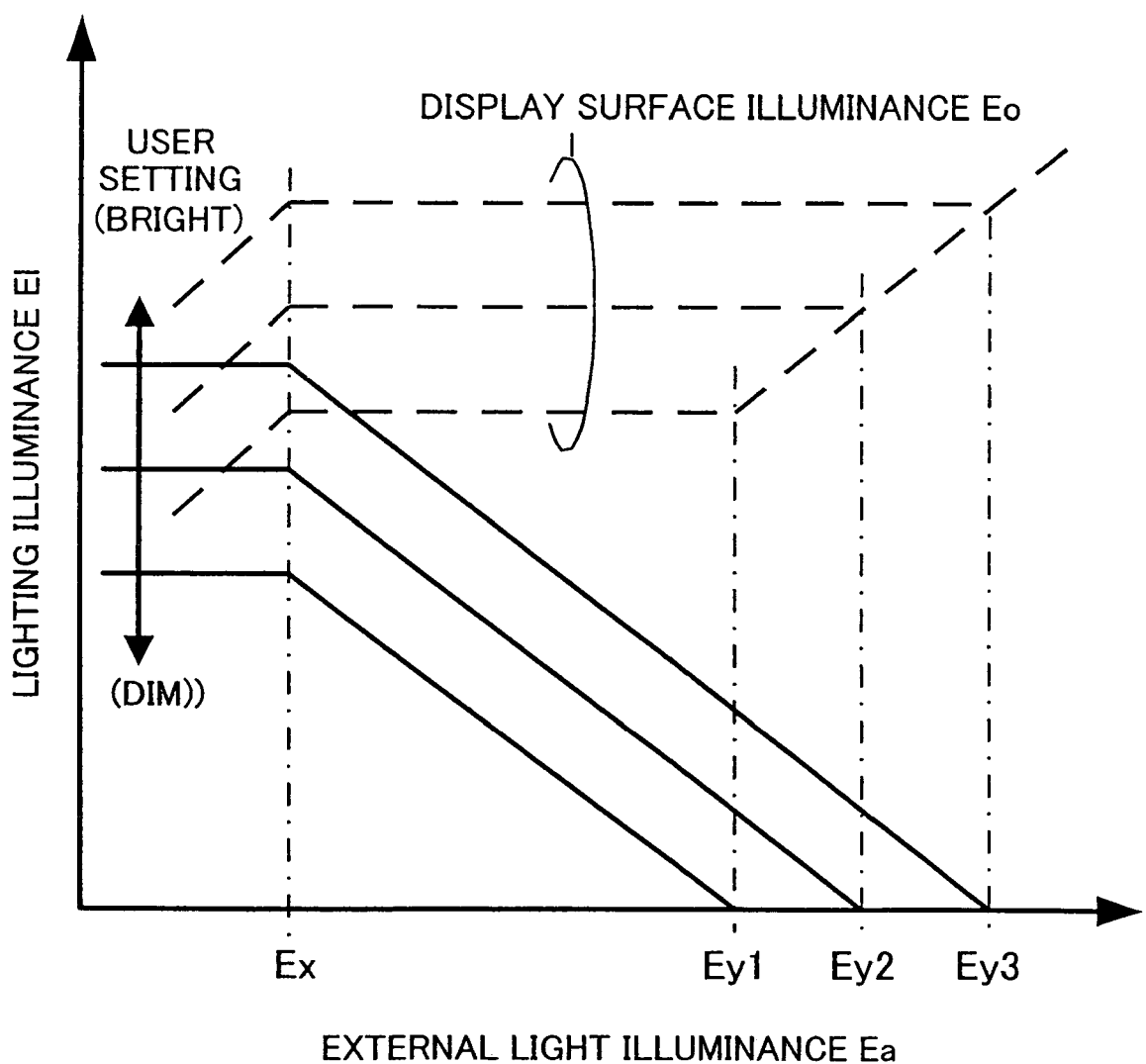
FIG. 7 is a diagram relating external light illuminance Ea with lighting illuminance El and display surface illuminance Eo according to the first embodiment.

FIG. 7 illustrates an example of control using a control system configured as described above. The relationship between the external light illuminance Ea and the lighting illuminance El by the front light 19 is roughly illustrated as in the figure. In the figure, the lighting illuminance El is shown in solid lines, and the display surface illuminance Eo is shown in dashed lines.

Here, a case has been illustrated where the lighting set level can be set to three stages as (dim)-(medium)-(bright).

As shown in the figure, in the light control level u externally set by each light control level setting signal, the external light illuminance Ea increasing within a range more than a certain value (Ex in the figure) of the external light illuminance operates to lower the lighting illuminance El. Consequently, the display surface illuminance Eo is kept approximately constant as a predetermined value in accordance with the light control level setting signal.

Here, the control range in the lighting control will be considered. The range depends mostly on the range of the display surface illuminance Eo detected by the light sensor 10 and the control range in the amount of emission from the LED 20. As for a reflective liquid crystal display device, differing from a transmissive liquid crystal display device or a self-luminous display device, when the display surface illuminance is high in an environment where the external light is bright, the display can be rather brighter than the transmissive device and the self-luminous device. Therefore, in an environment where a display surface illuminance Eo higher than a certain level is obtainable, naturally no lighting by the front light 19 is needed, and the display is bright enough with the external light only.

Because of these factors, it is under a relatively dark environment in the room that the lighting control of the front light 19 is needed.

Meanwhile, the upper limits of the display surface illuminance Eo as controlled by the lighting control are the values corresponding to the external light illuminance when the lighting is off (Ey1 through Ey3 in FIG. 7).

In other words, when the external light illuminance Ea is less than Ex, the lighting illuminance El needs to be set to maximum, while as the external light illuminance Ea increases, the lighting illuminance El is controlled to maintain the desired display surface illuminance Eo. No lighting is needed when the external light illuminance is high enough, that is, in an environment bright enough (Ey1 through Ey3). The lighting control ranges are the ranges in which the external light illuminance Ea is Ex<Ea<Ey1 through Ey3.

Therefore, the sensitivity and the dynamic range of the light sensor including the aforementioned nonlinearity, and the control range of the amount of emission from the LED 20 may be determined so as to set the upper limits Ey1 through Ey3 of the control range of the lighting control to several hundred 1×(lux), and to set the lower limit Ex to several 1×(lux).

As mentioned above, the former, the sensitivity and the dynamic range, can be appropriately set according to the resistance of the photodetecting element 11 and the reference resistance element 12, that is, the component sizes.

The latter, the amount of emission from the LED, can be set in view of the reflectance of the display surface according to the number of LEDs 20.

Moreover, operations of the lighting control circuit 22 in the embodiment are easily realized by software processing in an MPU (microprocessor unit).

As described above, because in Embodiment 1 the device has been configured so that the light sensors detect the display surface illuminance and according to the detection result the luminous intensity of the front light is controlled by the lighting control circuit to keep the display surface illuminance an approximately constant predetermined value, even if the light intensity of external light illuminating from outside of the device varies, the amount of emission from the front light can be automatically controlled to maintain automatically an appropriate display luminance.

Additionally, in a case where under a relatively bright environment an adequate display luminance is achieved with external light only, the amount of emission from the front light can be lowered to reduce the electric power consumed in vain by the front light.

Moreover, because it is not necessary to use memory for storing beforehand the relationship between the display surface illuminance and the luminous intensity of the front light, an automatic light control can be easily realized with a simple circuit configuration.

Furthermore, because the photodetecting elements are formed in the vicinity of the pixel matrix on the TFT array substrate, the display surface illuminance can be detected with fidelity to reduce error in controlling light from the front light. Additionally, it is not necessary to provide light sensors separate from the liquid crystal display panel, whereby the device size can be kept from increasing.

Moreover, because the pixel TFT is formed of low temperature polycrystalline silicon, and the photodetecting elements in the light sensors are formed of amorphous silicon, the photodetecting elements can be integrated with the liquid crystal display panel, and it is not necessary to provide light sensors separately from the liquid crystal display panel, whereby the device size can be kept from increasing.

Moreover, because the portions where the black matrix layer is not located are present at the positions corresponding to the photodetecting portions of photodetecting elements, even if the photodetecting elements are located on the TFT array substrate directly below the black matrix layer on the periphery of the display surface, the photodetecting elements can receive light, whereby the size of the liquid crystal display panel and thus the liquid crystal display device can be kept from increasing.

Furthermore, because the device is configured to supply a first potential (Vd) to one end of a pair of components composed of the photodetecting element 11 and the reference resistance element 12 formed on the array substrate so as to be connected in series with the photodetecting element, to supply a second potential (GND) to the other end thereof, and to output the potential (Vm) at the connection point between the photodetecting element and the reference resistance element as the result of detecting the illuminance on the photodetecting portion in the photodetecting element, with a simple configuration the variation in photodetecting element resistance can be picked out as the illuminance detection result.

Furthermore, because the amount of emission from the front light is controlled in accordance with the result of correcting the nonlinearity of the connection-point potential (Vm) of the photodetecting element and the reference resistance element, the display surface illuminance can be controlled to be constant to maintain automatically an appropriate display luminance.

Embodiment 2.

FIGS. 8A and 8B are diagrams illustrating positions of the photodetecting elements 11 in the liquid crystal display device according to Embodiment 2 for carrying out the invention, in which FIG. 8A is a plan view, and FIG. 8B is a right side view from rightward of FIG. 8A. In the figure, components with reference marks identical with those in FIGS. 3A and 3B are identical or corresponding ones.

In Embodiment 1, the device is configured so that, by providing non-formed portions 38 at the portions corresponding to the photodetecting elements 11 in the black matrix layer 36, the photodetecting element 11 is not prevented from receiving irradiating light from the front light 19 and from external light. Meanwhile in the present embodiment the device is configured with the photodetecting elements 11 arranged in positions on the TFT array substrate 30 corresponding to a gap between the display surface X and the black matrix layer 36 so as not to be prevented from receiving light. It will be obvious that the gap between the display surface and the black matrix layer 36 should be a gap of size such that the photodetecting elements 11 are not prevented from receiving light.

As described above in Embodiment 2, the photodetecting portions of the photodetecting elements are located at the positions corresponding to the gap between the display surface region and the black matrix layer, whereby the size of the liquid crystal display panel is not expanded peripherally, and thus the size of the liquid crystal display device can be kept from increasing.

Embodiment 3.

In Embodiment 1 described above, the device is configured so that the display surface illuminance is detected by the light sensor, and according to the detection result the lighting control circuit controls the luminous intensity of the front light to keep the display surface illuminance approximately constant. However, it is conceivable that when the device is in actual use, the display will be more clearly viewable by instead lowering the display luminance in an environment where it is dark, and by instead raising the display luminance in a bright environment.

In the present embodiment a case will be described where the display surface illuminance is controlled not to be kept approximately constant, but to increase in accordance with the external light illuminance.

Figure 9:
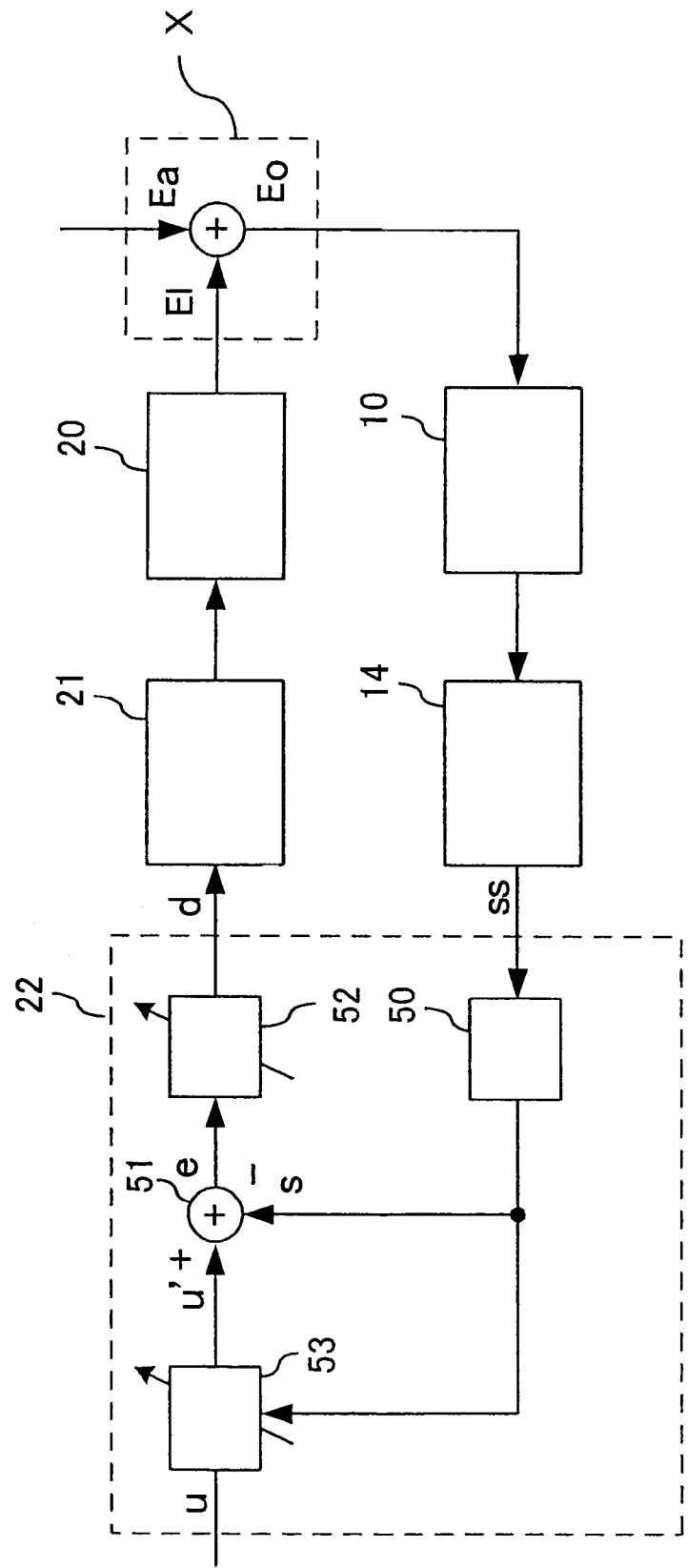
FIG. 9 is a diagram illustrating a control system for the front light in a third embodiment.
Figure 10:
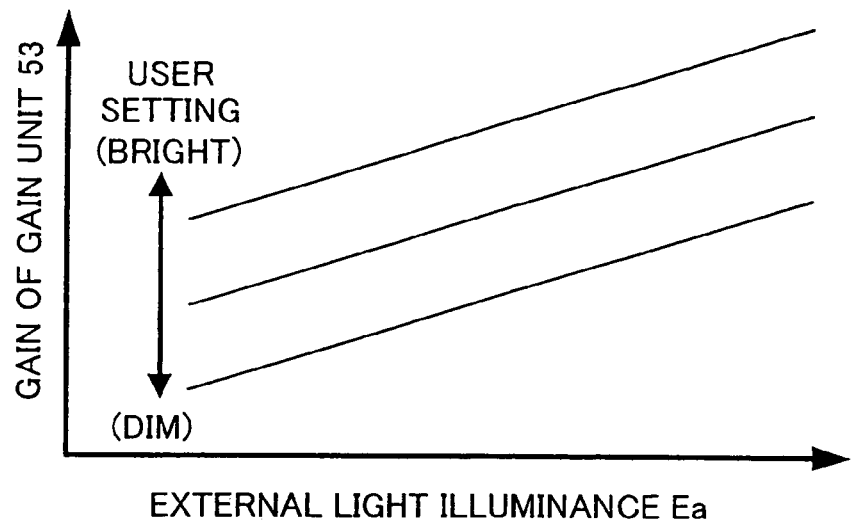
FIG. 10 is a diagram illustrating a gain characteristic of a variable gain unit 53 according to the third embodiment.

FIG. 9 is a diagram illustrating a configuration of the control system for the front light in Embodiment 3. As a stage prior to the error detection unit 51 in the control system for the front light 19 in Embodiment 1 described according to FIG. 6, a variable gain unit 53 is added, and, according to the corrected digital illuminance detection signal s, the gain of the variable gain unit 53 is set. More specifically, in the variable gain unit 53, as shown in FIG. 10 the gain is set so as to increase in accordance with the detected display surface illuminance.

Then for the control target u set in accordance with the externally inputted light control level setting signal, a modified control target u whose level has been varied by the variable gain unit 53 is outputted to the error detection unit 51.

Figure 11:
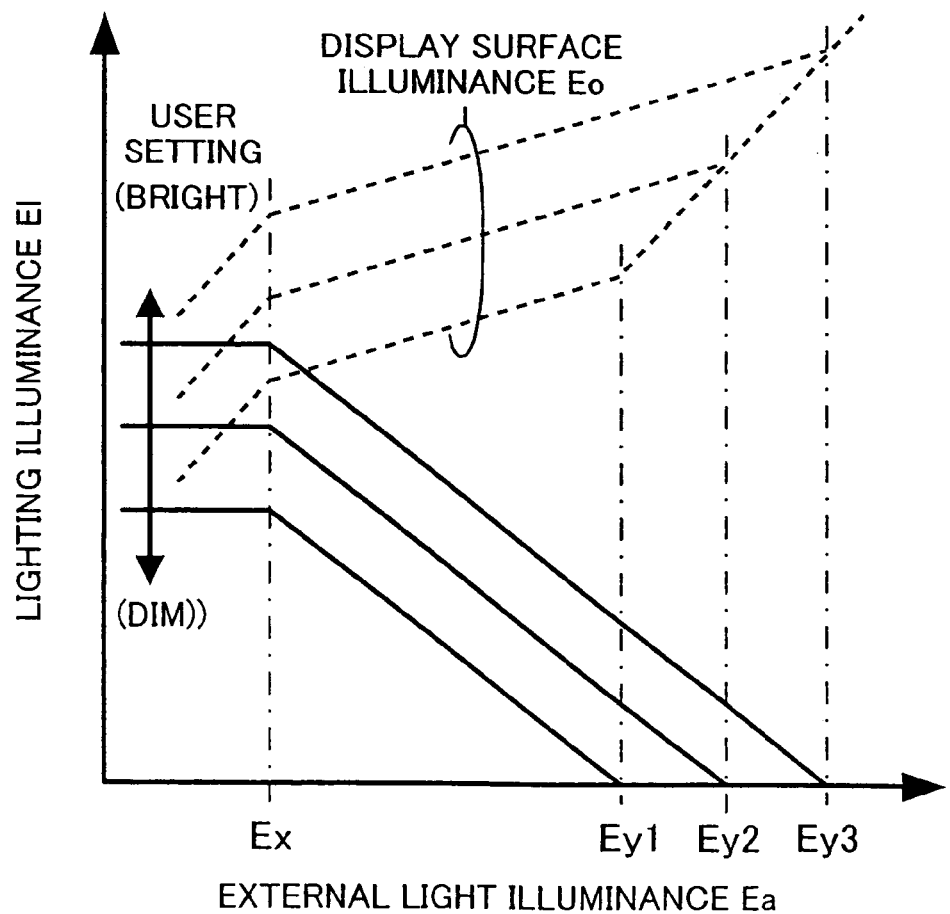
FIG. 11 is a diagram relating the external light illuminance Ea with the lighting illuminance El and the display surface illuminance Eo according to the third embodiment.
Figure 12:
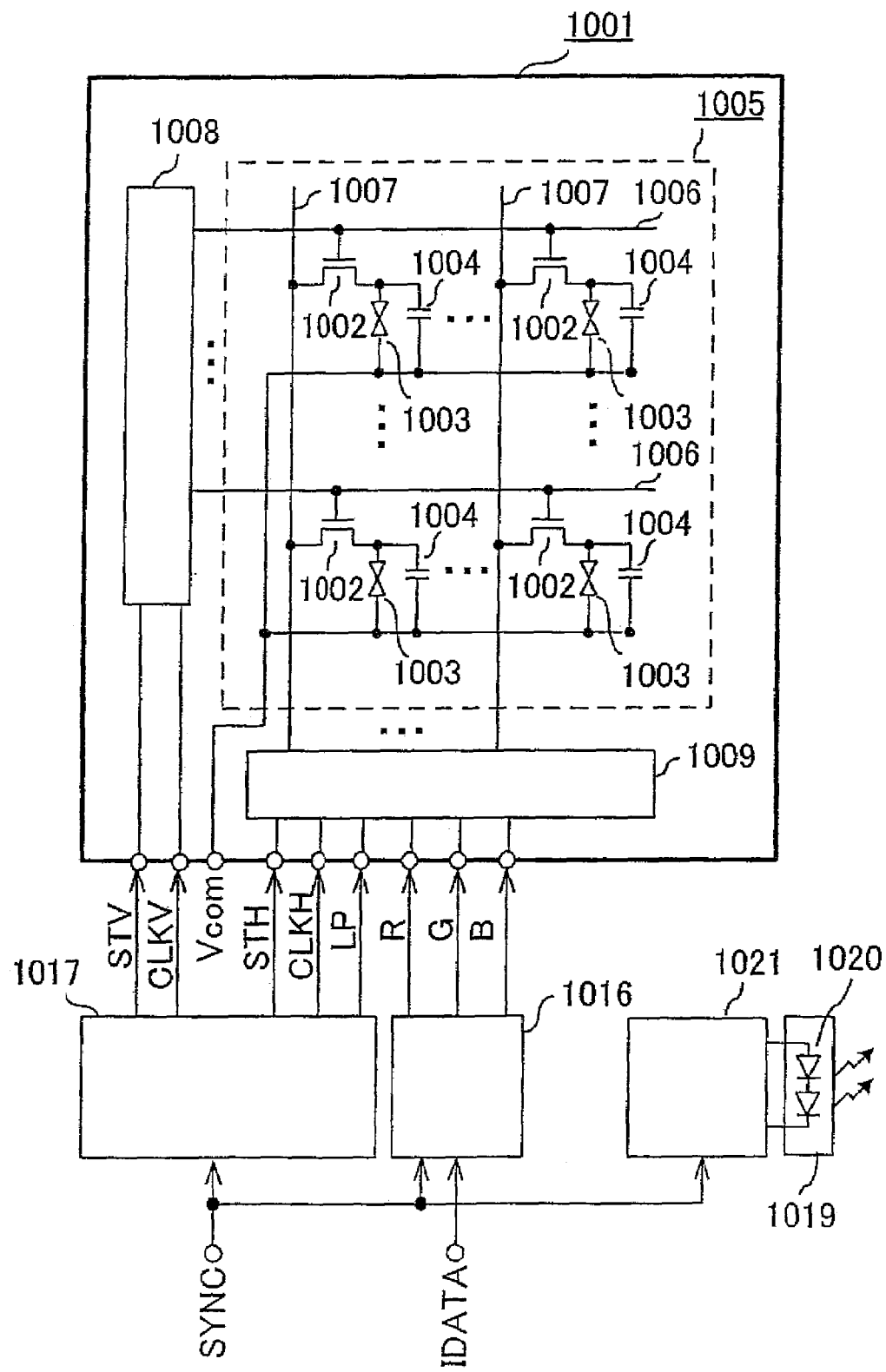
FIG. 12 is a diagram illustrating a circuit configuration of a conventional liquid crystal display device.

FIG. 11 illustrates an example of control using the control system configured as described above. The relationship between the external light illuminance Ea and the lighting illuminance El from the front light 19 is roughly as is illustrated in the figure. As shown in the figure, in the light control level u externally set by each light control level setting signal, the external light illuminance Ea increasing within a range more than a certain value (Ex in the figure) operates to lower the lighting illuminance El, not to keep the display surface illuminance Eo approximately constant as in Embodiment 1, but to control it so that it gradually increases to become a predetermined value. More specifically, within the lighting control range in which the external light illuminance Ea is Ex<Ea<Ey1 through Ey3, the display surface illuminance Eo is controlled to increase as the external light illuminance Ea increases.

As described above, in Embodiment 3 because the device has been configured so that the light sensor detects the display surface illuminance, and, in accordance with the detection result, the lighting control circuit controls the luminous intensity of the front light so that the display surface illuminance gradually increases to become a predetermined value, even if the external light intensity illuminating from outside of the device varies, the amount of emission from the front light is automatically controlled to maintain automatically an appropriate display luminance.

Additionally, under a relatively bright environment when an adequate display luminance is achieved with external light only, the amount of emission from the front light can be lowered to reduce the electric power consumed in vain by the front light.

Moreover, although in each embodiment described above the device has been configured so that the four light sensors 10 are provided, and the photodetecting portions in the photodetecting elements 11 constituting the sensors are disposed in the vicinity of the four corners on the periphery of the pixel matrix 5, any number of light sensors 10 may be used, and the photodetecting portions in the photodetecting elements 11 can be disposed in any positions on the periphery of the pixel matrix.

For example, using two light sensors 10 the photodetecting portions in the photodetecting elements 11 may be disposed on the right side and on the left side on the periphery of the pixel matrix 5.

Furthermore, in each embodiment described above the device has been configured so that the time average value of the corrected digital illuminance detection signals according to the illuminance detection signals obtained from each light sensor 10 is obtained, and further the average of this value for the number of sensors is obtained. However, using more than two light sensors 10, when a detection output from one light sensor 10 is obviously larger or smaller than the detection outputs from the other light sensors 10, the detection output from the sensor may be eliminated as an error detection result, whereby detection accuracy of the display surface illuminance will be likewise enhanced.

INDUSTRIAL APPLICABILITY

A liquid crystal display device according to the invention is particularly used as a reflective liquid crystal display device installed in a portable device such as a mobile phone, a mobile information terminal, or an electronic notepad, where the external light illuminance varies depending on the use environment.

What is claimed is:

1. A liquid crystal display device comprising:
   a liquid crystal display panel having a display surface and producing a display by reflecting light incident through said display surface;
   lighting means located at a front side of said display surface for irradiating light illuminating the front side of said display surface;
   light-detecting means for detecting illumination of said display surface by ambient light and by light irradiated by said lighting means, said light-detecting means being located proximate said display surface; and
   lighting control means for controlling luminous intensity of said lighting means through feedback control that reduces difference between the illumination of said display surface detected by said light-detecting means and an externally input light control target.

2. The liquid crystal display device according to claim 1, further comprising an array substrate on which is located pixel matrix including a plurality of pixels, each pixel having a reflecting electrode, on an insulating substrate, wherein said light-detecting means is located proximate said pixel matrix on said array substrate.

3. The liquid crystal display device according to claim 2, wherein:
   said pixel matrix comprises a thin film transistor for controlling application of voltage applied to a liquid crystal;
   said thin film transistor is polycrystalline silicon; and
   a photodetector of said light-detecting means is amorphous silicon.

4. The liquid crystal display device according to claim 3, further comprising a resistor on said array substrate and connected in series with said photodetector, as a serially connected pair of components, wherein:
   a first potential is supplied to a first end of said serially connected pair of components and a second potential is supplied to a second end of said serially connected pair of components; and
   an electric potential at a connection point between said photodetector and said resistor, varying in accordance with illuminance at a light incident portion of said photodetector, is output as the illumination of said display surface that is detected.

5. The liquid crystal display device according to claim 4, wherein:
   nonlinearity of the potential at the connection point of said photodetector and said resistor with respect to detection of the illumination of said photodetector is corrected; and
   the luminous intensity of said lighting means is controlled in accordance with the non-linearity that is corrected.

6. The liquid crystal display device according to claim 2, further comprising a color filter substrate having an area with a marginal portion corresponding to said display surface and including a black matrix layer, and constituting, in combination with said array substrate, a liquid crystal cell, wherein:
   said light-detecting means is located on said array substrate where said array substrate corresponds to said marginal portion where said black matrix layer is located; and
   a portion where the black matrix layer is not present at a position corresponding to a light incident portion of a photodetector of said light-detecting means.

7. The liquid crystal display device according to claim 2, further comprising a color filter substrate having an area with a marginal portion corresponding to said display surface and including a black matrix layer, and constituting, in combination with said array substrate, a liquid crystal cell, wherein:
   said light-detecting means is located on said array substrate where said array substrate corresponds to said marginal portion where said black matrix layer is located; and
   a light incident portion of a photodetector is located at a gap between said display-surface and said black matrix layer.

8. The liquid crystal display device according to claim 1, wherein said lighting control means is controlled within a controllable range of said lighting control means to keep the illumination of said display surface substantially constant.

* * * * *